United States Patent
Zhang et al.

(10) Patent No.: US 11,930,669 B2
(45) Date of Patent: Mar. 12, 2024

(54) DISPLAY PANEL HAVING A LIGHT SHIELDING LAYER WITH AN IMAGING PINHOLE AT SELECT MINIMUM DISTANCES FROM COLOR SUB-PIXELS, A MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Bo Zhang, Beijing (CN); Yulong Wei, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 903 days.

(21) Appl. No.: 16/964,169

(22) PCT Filed: Sep. 27, 2019

(86) PCT No.: PCT/CN2019/108526
§ 371 (c)(1),
(2) Date: Jul. 22, 2020

(87) PCT Pub. No.: WO2021/056413
PCT Pub. Date: Apr. 1, 2021

(65) Prior Publication Data
US 2023/0165072 A1    May 25, 2023

(51) Int. Cl.
*H10K 59/126*    (2023.01)
*G06V 40/13*    (2022.01)
(Continued)

(52) U.S. Cl.
CPC ....... *H10K 59/126* (2023.02); *G06V 40/1318* (2022.01); *H10K 59/1201* (2023.02);
(Continued)

(58) Field of Classification Search
CPC ...... H10K 50/81; H10K 50/813; H10K 50/82; H10K 50/822; H10K 59/1201;
(Continued)

(56) References Cited

U.S. PATENT DOCUMENTS 11,121,330 B2 *   9/2021   Li ...................... H10K 59/123
2019/0006440 A1 *   1/2019   Sun ..................... H10K 59/65
(Continued)

*Primary Examiner* — Younes Boulghassoul
(74) *Attorney, Agent, or Firm* — McCoy Russell LLP

(57) ABSTRACT

The present disclosure provides a display panel and a manufacturing method thereof, and a display device. The display panel includes a base substrate, a light shielding layer and a pixel definition layer which are provided on the base substrate in turn; the light shielding layer includes an imaging pinhole; the display panel further includes a plurality of fingerprint recognition sensors arranged in an array, the fingerprint recognition sensors are provided on the base substrate; the light shielding layer is provided on a light incoming side of the fingerprint recognition sensors; a minimum distance between the imaging pinhole and the organic light emitting layer in the red sub-pixel is less than a minimum distance between the imaging pinhole and the organic light emitting layer in the green sub-pixel and is also less than a minimum distance between the imaging pinhole and the organic light emitting layer in the blue sub-pixel.

14 Claims, 8 Drawing Sheets

(51) Int. Cl.
  *H10K 59/12*   (2023.01)
  *H10K 59/121*  (2023.01)
  *H10K 59/35*   (2023.01)
  *H10K 59/65*   (2023.01)
  *H10K 59/80*   (2023.01)

(52) U.S. Cl.
  CPC ........... *H10K 59/121* (2023.02); *H10K 59/35* (2023.02); *H10K 59/65* (2023.02); *H10K 59/8051* (2023.02)

(58) Field of Classification Search
  CPC .. H10K 59/121; H10K 59/122; H10K 59/126; H10K 59/35; H10K 59/352; H10K 59/353; H10K 59/8051; H10K 59/80515; H10K 59/8052; H10K 59/80521; H10K 59/60; H10K 59/65; G06V 40/1318
  See application file for complete search history.

(56) References Cited

U.S. PATENT DOCUMENTS

| | | | |
|---|---|---|---|
| 2019/0156097 A1* | 5/2019 | Liu | H10K 59/65 |
| 2019/0220649 A1* | 7/2019 | Zhu | H10K 59/65 |
| 2020/0034600 A1* | 1/2020 | Chan | G06F 3/0412 |
| 2020/0075695 A1* | 3/2020 | Zhao | G06V 40/1318 |
| 2020/0203468 A1* | 6/2020 | Zeng | H10K 59/65 |
| 2020/0212135 A1* | 7/2020 | Zhang | H10K 59/40 |

* cited by examiner

DISPLAY PANEL HAVING A LIGHT SHIELDING LAYER WITH AN IMAGING PINHOLE AT SELECT MINIMUM DISTANCES FROM COLOR SUB-PIXELS, A MANUFACTURING METHOD THEREOF, AND DISPLAY DEVICE

CROSS-REFERENCE TO RELATED APPLICATIONS

This application is the U.S. National Phase of International Application No. PCT/CN2019/108526 filed on Sep. 27, 2019. The entire contents of the above-listed application is hereby incorporated by reference for all purposes.

TECHNICAL FIELD

The present disclosure relates to the field of display technology, and in particular to a display panel and a manufacturing method thereof, and a display device.

BACKGROUND

In the display industry, with the continuous development of technology, fingerprint recognition technology is maturing and improving. In the field of organic light-emitting diode (OLED) full-screen mobile phones, under-screen fingerprint recognition technology is becoming more and more popular. In order to realize the under-screen fingerprint recognition, the relevant display panel may be provided with a light shielding layer, and imaging pinhole are opened in the light shielding layer. According to the theory of pinhole imaging, the light reflected by the fingerprint is transmitted to the fingerprint recognition sensor through the organic film layer for fingerprint recognition. However, the fingerprint recognition effect of the pinhole imaging needs to be improved.

SUMMARY

In an aspect, an embodiment of the present disclosure provides a display panel including a base substrate, and a light shielding layer and a pixel definition layer provided on the base substrate in sequence, opening regions arranged in an array are formed on the pixel definition layer; the display panel further includes an organic light emitting layer formed in the opening region, and a light reflection layer provided on a side of the organic light emitting layer away from the light shielding layer; the light shielding layer includes an imaging pinhole;

the display panel further includes a plurality of fingerprint recognition sensors arranged in an array, the fingerprint recognition sensors are provided on a side of the base substrate away from the light shielding layer; the light shielding layer is provided on a light incoming side of the fingerprint recognition sensors;

pixels in the display panel includes red sub-pixels, green sub-pixels and blue sub-pixels;

a minimum distance between the imaging pinhole and the organic light emitting layer in the red sub-pixel is less than a minimum distance between the imaging pinhole and the organic light emitting layer in the green sub-pixel;

the minimum distance between the imaging pinhole and the organic light emitting layer in the red sub-pixel is less than a minimum distance between the imaging pinhole and the organic light emitting layer in the blue sub-pixel.

Optionally, an angle between light that is emitted from the organic light emitting layer and reflected by the light reflection layer to the imaging pinhole and a first direction is greater than a first angle $\theta$, so that the light cannot pass through the imaging pinhole to the fingerprint recognition sensor;

the first direction is a direction perpendicular to the light shielding layer and directing to the base substrate.

Optionally, the first angle $\theta$ is greater than or equal to 20 degrees.

Optionally, a thickness of the organic light emitting layer is greater than or equal to 500 nm and less than or equal to 600 nm.

Optionally, the display panel further includes an anode layer provided between the light shielding layer and the pixel definition layer;

an orthographic projection of the imaging pinhole on the base substrate does not overlap with an orthographic projection of the anode layer on the base substrate.

Optionally, the display panel further includes a thin film transistor array layer provided between the base substrate and the anode layer;

an orthographic projection of a metal film layer in the thin film transistor array layer on the base substrate does not overlap with the orthographic projection of the imaging pinhole on the base substrate.

Optionally, the thin film transistor array layer includes a first source-drain metal layer and a semiconductor layer; the light shielding layer is a metal layer;

the anode layer of a red sub-pixel closest to the imaging pinhole is connected to the light shielding layer through a first via, the light shielding layer is connected to the first source-drain metal layer through a second via, the first source-drain metal layer is connected to a drain region of the semiconductor layer through a third via, so as to receive a data voltage signal.

Optionally, the thin film transistor array layer includes a semiconductor layer; an anode of a blue sub-pixel adjacent to the imaging pinhole is connected to a drain region of the semiconductor layer through a via, so as to receive a data voltage signal.

Optionally, the thin film transistor array layer includes a semiconductor layer; an anode of a green sub-pixel adjacent to the imaging pinhole is connected to a drain region of the semiconductor layer through a via, so as to receive a data voltage signal.

Optionally, the thin film transistor array layer includes a semiconductor layer; the light shielding layer is a metal layer;

the light shielding layer further includes a hollow structure, a pattern of the light shielding layer further includes a conductive intermediate-connection pattern portion; an orthographic projection of the conductive intermediate-connection pattern portion on the base substrate is within an orthographic projection of the hollow structure on the base substrate;

the anode layer is connected to the drain region of the semiconductor layer through the conductive intermediate-connection pattern portion.

Optionally, the light shielding layer is a metal layer, the pattern of the light shielding layer further includes a power supply voltage pattern portion for receiving a power supply voltage signal, an orthographic projection of the power supply voltage pattern portion on the base substrate does not overlap with an orthographic projection of the conductive intermediate-connection pattern portion on the base substrate.

Optionally, the angle is greater than or equal to a second angle θ1 and less than or equal to a third angle θ2; the second angle θ1 is greater than the first angle θ;

θ1=arctan((c−d)/a), θ2=arctan((b−e)/a);

where a is a first distance, b is a second distance, d is a third distance, e is a fourth distance, c is a fifth distance;

the first distance a is a difference between a minimum distance from the light reflection layer to the base substrate and a maximum distance from the imaging pinhole to the base substrate;

in a case that the organic light emitting layer of the sub-pixel in the display panel is placed in a horizontal direction, the second distance b is a sum of a shortest distance between an orthographic projection of the organic light emitting layer on the base substrate and an orthographic projection of the imaging pinhole on the base substrate, and a width of the imaging pinhole;

in a case that the organic light emitting layer is placed in the horizontal direction, the third distance d is a shortest distance between an orthographic projection on the base substrate of an intersection point of first light, which is emitted to the light reflection layer from an uppermost end of the organic light emitting layer, and the light reflection layer, and the orthographic projection on the base substrate of the organic light emitting layer;

in a case that the organic light emitting layer is placed in the horizontal direction, the fourth distance e is a shortest distance between an orthographic projection on the base substrate of an intersection point of second light, which is emitted to the light reflection layer from a lowermost end of the organic light emitting layer, and the light reflection layer, and the orthographic projection on the base substrate of the organic light emitting layer;

the fifth distance c is a shortest distance between the orthographic projection of the organic light emitting layer on the base substrate and an orthographic projection of the imaging pinhole on the base substrate;

in a case that the organic light emitting layer is placed in the horizontal direction, the first light is emitted to the light reflection layer, and reflected by the light reflection layer to become first reflection light which is emitted to a first end of the imaging pinhole;

in a case that the organic light emitting layer is placed in the horizontal direction, the second light is emitted to the light reflection layer, and reflected by the light reflection layer to become second reflection light which is emitted to a second end of the imaging pinhole; a distance between an orthographic projection of the second end of the imaging pinhole on the base substrate and the orthographic projection of the organic light emitting layer on the base substrate is greater than a distance between an orthographic projection of the first end of the imaging pinhole on the base substrate and the orthographic projection of the organic light emitting layer on the base substrate.

In a second aspect, an embodiment of the present disclosure further provides a manufacturing method of a display panel including red sub-pixels, green sub-pixels and blue sub-pixels; wherein the manufacturing method of a display panel includes:

forming a light shielding layer and a pixel definition layer on a base substrate in sequence; opening regions arranged in an array being formed on the pixel definition layer; the light shielding layer including an imaging pinhole;

forming an organic light emitting layer in the opening region;

providing a light reflection layer on a side of the organic light emitting layer away from the light shielding layer;

providing a plurality of fingerprint recognition sensors arranged in an array on a side of the base substrate away from the light shielding layer;

setting a minimum distance between the imaging pinhole and the organic light emitting layer in the red sub-pixel to be less than a minimum distance between the imaging pinhole and the organic light emitting layer in the green sub-pixel;

setting the minimum distance between the imaging pinhole and the organic light emitting layer in the red sub-pixel to be less than a minimum distance between the imaging pinhole and the organic light emitting layer in the blue sub-pixel.

In a third aspect, an embodiment of the present disclosure further provides a display device including the above display panel.

Compared with the related art, the display panel and the manufacturing method thereof, and the display device described in the embodiments of the present disclosure improve the fingerprint recognition effect of the pinhole imaging by setting the location of the imaging pinhole.

DETAILED DESCRIPTION

Figure 1A:
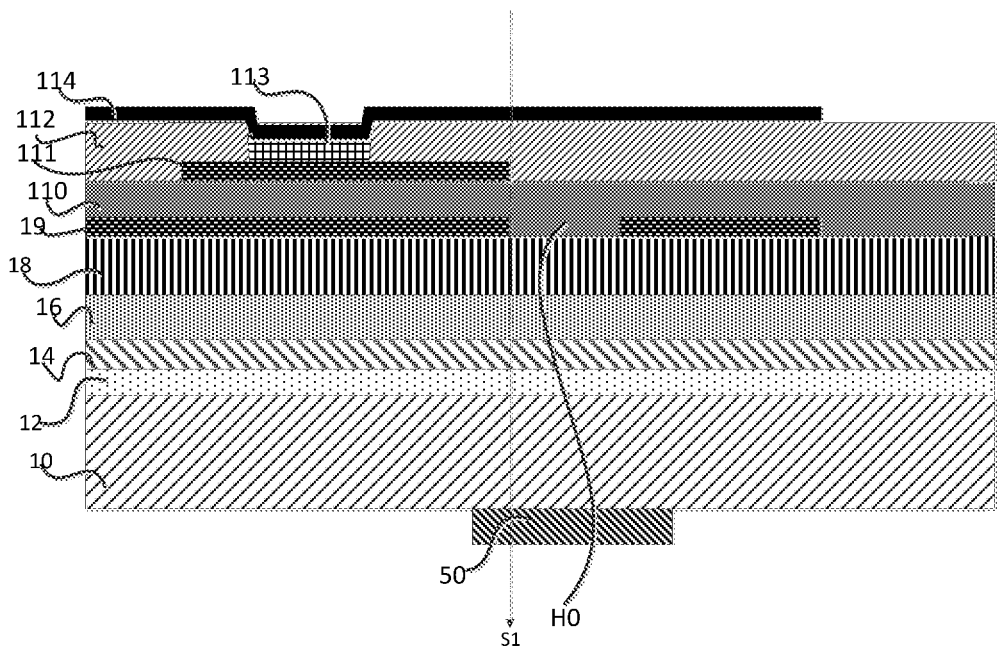
FIG. 1A is a first cross-sectional view of a display panel according to at least one embodiment of the present disclosure.

Hereinafter, the technical solutions in the embodiments of the present disclosure will be described clearly and thoroughly in conjunction with the drawings in the embodiments of the present disclosure. Obviously, the described embodiments are part of the embodiments of the present disclosure, but not all of the embodiments. Based on the embodiments in the present disclosure, all other embodiments obtained by a person of ordinary skill in the art without creative efforts should fall within the protection scope of the present disclosure.

A display panel according to at least one embodiment of the present disclosure includes a base substrate, and a light shielding layer and a pixel definition layer provided on the base substrate in sequence, opening regions arranged in an array are formed on the pixel definition layer; the display panel further includes an organic light emitting layer formed in the opening region, and a light reflection layer provided on a side of the organic light emitting layer away from the light shielding layer; the light shielding layer includes an imaging pinhole;

the display panel further includes a plurality of fingerprint recognition sensors arranged in an array, the fingerprint recognition sensors are provided on a side of the base substrate away from the light shielding layer; the light shielding layer is provided on a light incoming side of the fingerprint recognition sensors;

pixels in the display panel includes red sub-pixels, green sub-pixels and blue sub-pixels;

a minimum distance between the imaging pinhole and the organic light emitting layer in the red sub-pixel is less than a minimum distance between the imaging pinhole and the organic light emitting layer in the green sub-pixel;

the minimum distance between the imaging pinhole and the organic light emitting layer in the red sub-pixel is less than a minimum distance between the imaging pinhole and the organic light emitting layer in the blue sub-pixel.

In the display panel according to at least one embodiment of the present disclosure, the imaging pinhole is set to be closer to the red sub-pixel to eliminate the effect of red stray light on the pinhole imaging fingerprint recognition. By setting the location of the imaging pinhole, the fingerprint recognition effect of the pinhole imaging is improved.

In at least one embodiment of the present disclosure, an angle between light that is emitted from the organic light emitting layer and reflected by the light reflection layer to the imaging pinhole and a first direction is greater than a first angle θ, so that the light cannot pass through the imaging pinhole to the fingerprint recognition sensor;

the first direction is a direction perpendicular to the light shielding layer and directing to the base substrate.

In the display panel according to at least one embodiment of the present disclosure, the location of the imaging pinhole is set such that the angle between light that is emitted from the organic light emitting layer and reflected by the light reflection layer to the imaging pinhole and the first direction is greater than the first angle θ, so that the light (which is stray light) can be controlled so as not to pass through the imaging pinhole to the fingerprint recognition sensor, thereby improving the accuracy of the pinhole imaging fingerprint recognition.

In at least one embodiment of the present disclosure, θ can be greater than or equal to 20 degrees, but not limited thereto.

Optionally, θ may be equal to 20 degrees, 25 degrees, 30 degrees, 35 degrees, 40 degrees, 45 degrees, but not limited thereto.

In a specific implementation, the display panel according to at least one embodiment of the present disclosure may further include a plurality of fingerprint recognition sensors arranged in an array, the fingerprint recognition sensors are provided on a side of the base substrate away from the light shielding layer; the light shielding layer is provided on a light incoming side of the fingerprint recognition sensors, and the imaging pinhole permits light to pass therethrough to the fingerprint recognition sensor. The light emitted from the organic light emitting layer and reflected by the light reflection layer to the imaging pinhole is stray light. If the stray light enters the fingerprint recognition sensor through the imaging pinhole, the accuracy of fingerprint recognition will be affected.

At least one embodiment of the present disclosure can alleviate the following problem in the related art and thus optimize the design of pinhole imaging structure: in the related art, since the light reflection layer is provided on the side of the organic light emitting layer included in the display panel away from the light shielding layer, the light emitted from the organic light emitting layer will become stray light when it is reflected by the light reflection layer, and the stray light may be emitted to the fingerprint recognition sensor through the imaging pinhole so that the fingerprint recognition effect is affected.

In at least one embodiment of the present disclosure, a second source-drain metal layer may be also used as the light shielding layer. A pattern of the second source-drain metal layer may include a power supply voltage pattern portion. The power supply voltage pattern portion is used to receive the power supply voltage signal VDD, that is, the light shielding layer may be a VDD wiring layer, but not limited thereto.

FIG. 1A is a first cross-sectional view of a display panel according to at least one embodiment of the present disclosure.

As shown in FIG. 1A, the display panel according to at least one embodiment of the present disclosure includes a base substrate 10, a first insulation layer 12, a first gate insulation layer 14, a second gate insulation layer 16, a second insulation layer 18, a light shielding layer 19, a planarization layer 110, an anode layer 111, a pixel definition layer 112, an organic light emitting layer 113, a light reflection layer 114 and a fingerprint sensor 50, wherein, the light shielding layer 19 is also the second source-drain metal layer, the pattern of the light shielding layer 19 includes a power supply voltage pattern portion, and the light shielding layer 19 includes an imaging pinhole H0;

the first insulation layer 12, the first gate insulation layer 14, the second gate insulation layer 16, the second insulation layer 18, the light shielding layer 19, the planarization layer 110, the anode layer 111, and the pixel definition layer 112 are disposed on the base substrate 10 in sequence;

opening regions arranged in an array are formed on the pixel definition layer 12; the organic light emitting layer 113 is formed in the opening region;

the light reflection layer 114 is provided on a side of the organic light emitting layer 113 away from the light shielding layer 19;

the fingerprint recognition sensor 50 is provided on a side of the base substrate 10 away from the light shielding layer 19;

the light shielding layer 19 is provided on a light incoming side of the fingerprint recognition sensor 50, and the imaging pinhole permits light to pass therethrough to the fingerprint recognition sensor 50;

an angle between light that is emitted from the organic light emitting layer 113 and reflected by the light reflection layer 114 to the imaging pinhole H0 and a first direction S1 is greater than a first angle θ, so that the light cannot pass through the imaging pinhole H0 to the fingerprint recognition sensor 50;

the first direction S1 is a direction perpendicular to the light shielding layer 19 and directing to the base substrate 10;

wherein θ is equal to 45 degrees, but not limited to this.

In at least one embodiment of the present disclosure, the light reflection layer 114 may be a cathode layer, a polarizer layer or an encapsulation film layer, but not limited thereto.

In at least one embodiment of the present disclosure, a gate voltage line and a reset signal line that are substantially perpendicular to the extending direction of the data line, etc., may also be provided below the light shielding layer 19.

The organic light emitting layer 113 shown in FIG. 1 is an organic light emitting layer in the red sub-pixel included in the display panel, but it is not limited thereto. In a specific implementation, the organic light emitting layer 113 may also be an organic light emitting layer in sub-pixels of other colors included in the display panel.

In a specific implementation, a fingerprint recognition sensor is provided on the side of the base substrate away from the light shielding layer. Since the fingerprint recognition sensor is relatively sensitive to red light, it is preferable to set the imaging pinhole close to the organic light emitting layer in the red sub-pixel to reduce the effect of other stray light on pinhole imaging fingerprint recognition.

In FIG. 1, only one imaging pinhole H0 and one fingerprint recognition sensor 50 are shown. In practical applications, the light shielding layer 19 may include a plurality of imaging pinholes, and the display panel may include a plurality of fingerprint recognition sensor arranged in an array.

In the embodiment shown in FIG. 1, the thickness of the first insulation layer 12 may be greater than or equal to 1116 angstroms and less than or equal to 1284 angstroms, the thickness of the first gate insulation layer 14 may be greater than or equal to 1235 angstroms and less than or equal to 1365 angstroms, the thickness of the second gate insulation layer 16 may be greater than or equal to 4650 angstroms and less than or equal to 5350 angstroms, the thickness of the second insulation layer 18 may be greater than or equal to 10200 angstroms and less than or equal to 15000 angstroms, the thickness of the planarization layer 110 may be greater than or equal to 14550 angstroms and less than or equal to 15450 angstroms, the thickness of the pixel definition layer 112 may be greater than or equal to 19400 angstroms and less than or equal to 30000 angstroms, the thickness of the organic light emitting layer 113 may be greater than or equal to 500 nm (nanometer) and less than or equal to 600 nm, but they are not limited thereto.

Optionally, in the embodiment shown in FIG. 1A, an active layer may be provided between the base substrate 10 and the first insulation layer 12, a first gate metal layer may be provided between the first insulation layer 12 and the gate insulation layer 14, a second gate metal layer may be provided between the first gate insulation layer 14 and the second gate insulation layer 16, and a first source-drain metal layer may be provided between the second gate insulation layer 16 and the second insulation layer 18, but these are not limitations.

Figure 1B:
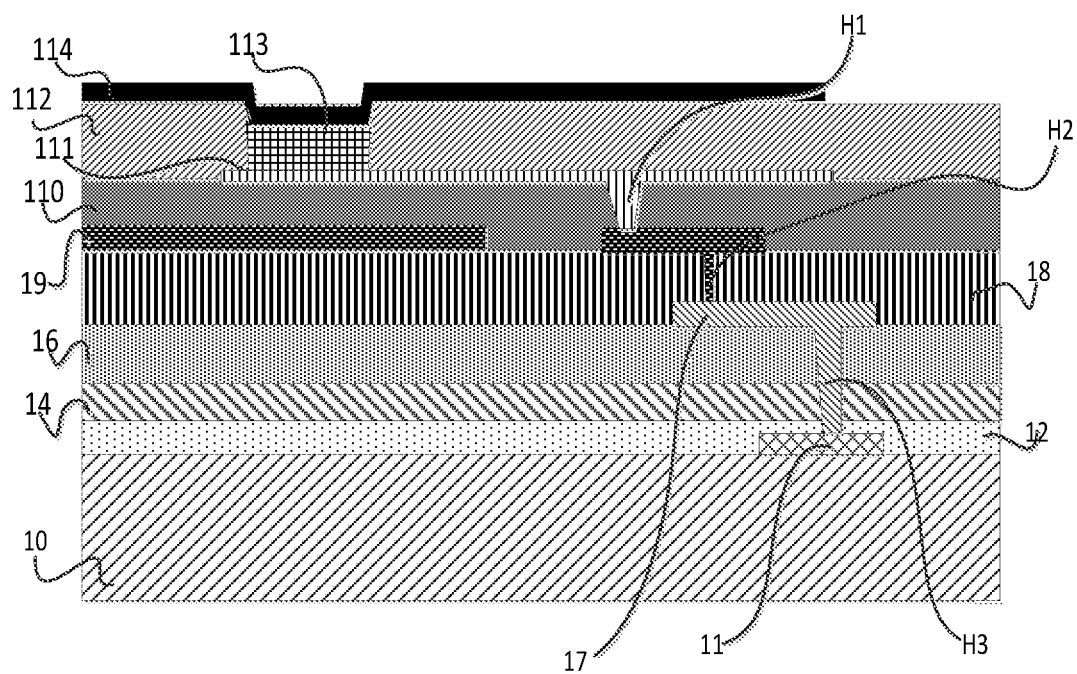
FIG. 1B is a second cross-sectional view of a display panel according to at least one embodiment of the present disclosure.

FIG. 1B is a second cross-sectional view of a display panel according to at least one embodiment of the present disclosure.

As shown in FIG. 1B, a display panel according to at least one embodiment of the present disclosure includes a base substrate 10, an active layer 11, a first insulation layer 12, a first gate insulation layer 14, a second gate insulation layer 16, a first source-drain metal layer 17, a second insulation layer 18, a light shielding layer 19, a planarization layer 110, an anode layer 111, a pixel definition layer 112, an organic light emitting layer 113, and a light reflection layer 114, wherein, the light shielding layer 19 is also the second source-drain metal layer, the pattern of the light shielding layer 19 includes a power supply voltage pattern portion and a conductive connection pattern portion;

the active layer 11, the first insulation layer 12, the first gate insulation layer 14, the second gate insulation layer 16, a first source-drain metal layer 17, the second insulation layer 18, the light shielding layer 19, the planarization layer 110, the anode layer 111, and the pixel definition layer 112 are disposed on the base substrate 10 in sequence;

opening regions arranged in an array are formed on the pixel definition layer 12; the organic light emitting layer 113 is formed in the opening region;

the light reflection layer 114 is provided on a side of the organic light emitting layer 113 away from the light shielding layer 19;

the fingerprint recognition sensor 50 is provided on a side of the base substrate 10 away from the light shielding layer 19;

the light shielding layer 19 is provided on a light incoming side of the fingerprint recognition sensor 50.

As shown in FIG. 1B, the anode layer 111 is the anode layer of the red sub-pixel adjacent to the imaging pinhole, and the anode layer 13 is electrically connected to the light shielding layer 19 through a first via H1 penetrating the planarization layer 110. The light shielding layer 19 is electrically connected to the first source-drain metal layer 17 through a second via H2 penetrating the second insulation layer 18, and the first source-drain metal layer 17 is electrically connected to the active layer 11 through a third via H3 penetrating the second gate insulation layer 16, the first gate insulation layer 14, and the first insulation layer 12.

As shown in FIG. 1B, the anode layer of the red sub-pixel adjacent to the imaging pinhole is electrically connected to the light shielding layer 19 through H1, the light shielding layer 19 is electrically connected to the first source-drain metal layer 17 through H2, and the first source-drain metal layer is electrically connected to the active layer 11 through H3. Since the red sub-pixel is adjacent to the imaging pinhole and the distance between the red sub-pixel and the imaging pinhole is relatively short, it is necessary to provide the second via H2 between the light shielding layer 19 and the first source-drain metal layer 17 for intermediate connection, in order to avoid the mutual influence between the imaging pinhole and the via.

However, for the green sub-pixel or blue sub-pixel adjacent to the imaging pinhole, since the distance between either of them and the imaging pinhole is relatively long, it is not necessary to provide a via for intermediate connection. Thus, the anode layer of the green sub-pixel or the blue sub-pixel may be electrically connected to the drain region of the active layer through a via to receive the data voltage signal.

In the embodiment shown in FIG. 1B, a gate voltage line and a reset signal line that are substantially perpendicular to the extending direction of the data line, etc., may also be provided below the light shielding layer 19.

Figure 2A:
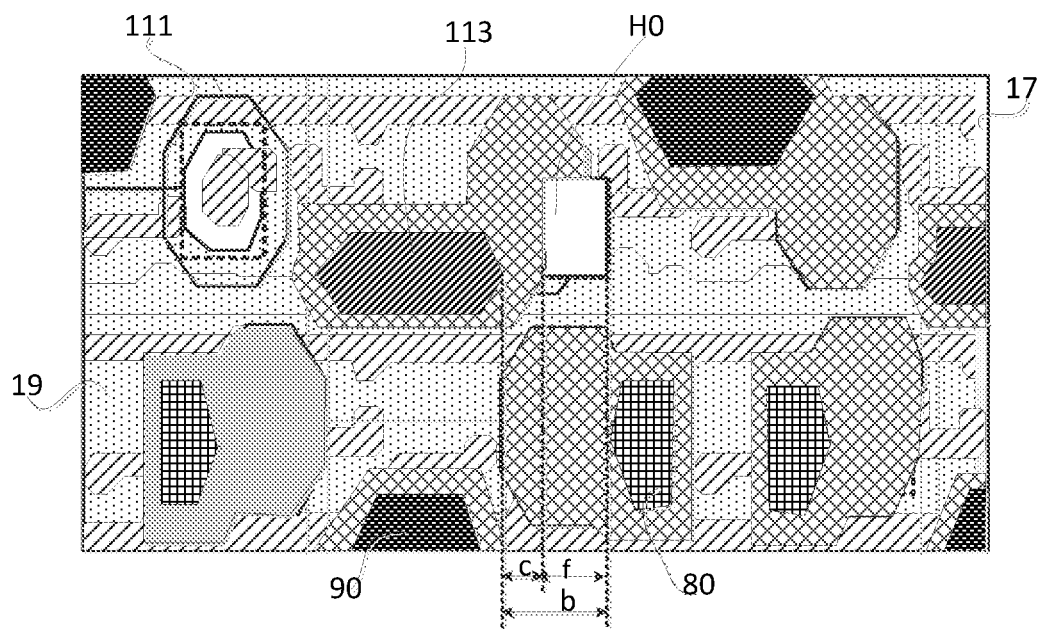
FIG. 2A is a top view of at least one embodiment of a display panel according to at least one embodiment of the present disclosure during manufacture of the display panel.

FIG. 2A is a top view of a product in which the organic light emitting layer is formed (the light reflection layer 114 has not been manufactured yet at this time) during manufacture of the display panel according to at least one embodiment of the present disclosure.

In FIG. 2A, the reference numeral H0 indicates the imaging pinhole, the reference numeral 113 indicates the organic light emitting layer of the red sub-pixel in FIG. 1; as can be seen from FIG. 2, c is the shortest distance between the orthographic projection of the organic light emitting layer 113 on the base substrate 10 and the orthographic projection of the imaging pinhole H0 on the base substrate 10; in FIG. 2A, the reference numeral 17 indicates the first source-drain metal layer, the reference numeral 19 indicates a light-shielding layer, and the reference numeral 111 indicates the anode layer;

and in FIG. 2A, the reference numeral b indicates the second distance;

in the embodiment shown in FIG. 2A, the organic light emitting layer 113 is located on the left side of the imaging pinhole H0; then, in FIG. 2A, the second distance b is a sum of a shortest distance between the orthographic projection of the organic light emitting layer 113 on the base substrate 10 and the orthographic projection of the imaging pinhole H0 on the base substrate 10, and a width f of the imaging pinhole H0.

In FIG. 2A, the reference numeral 80 indicates the organic light emitting layer of the green sub-pixel, and the reference numeral 90 indicates the organic light emitting layer of the blue sub-pixel.

As shown in FIG. 2A, the organic light emitting layer 113 is disposed on the left side of the imaging pinhole H0.

In at least one embodiment of the display panel shown in FIG. 2A, the light shielding layer (also the second source-drain metal layer) is disposed over the first source-drain metal layer, and the anode layer is disposed over the light shielding layer.

Figure 2B:
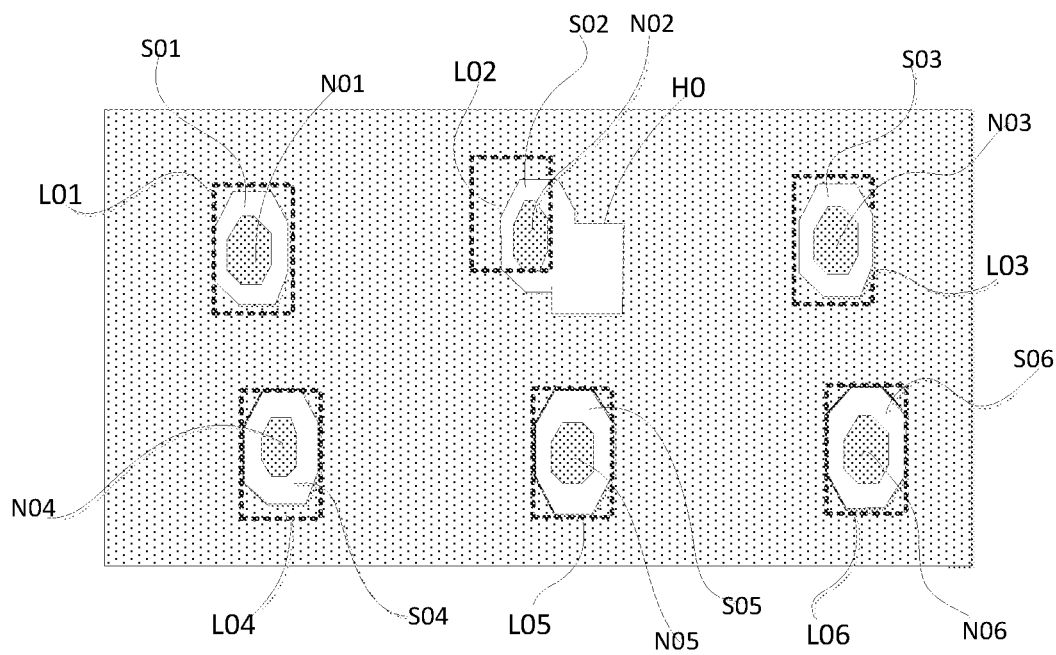
FIG. 2B is a top view of a light shielding layer in FIG. 2A.
Figure 2C:
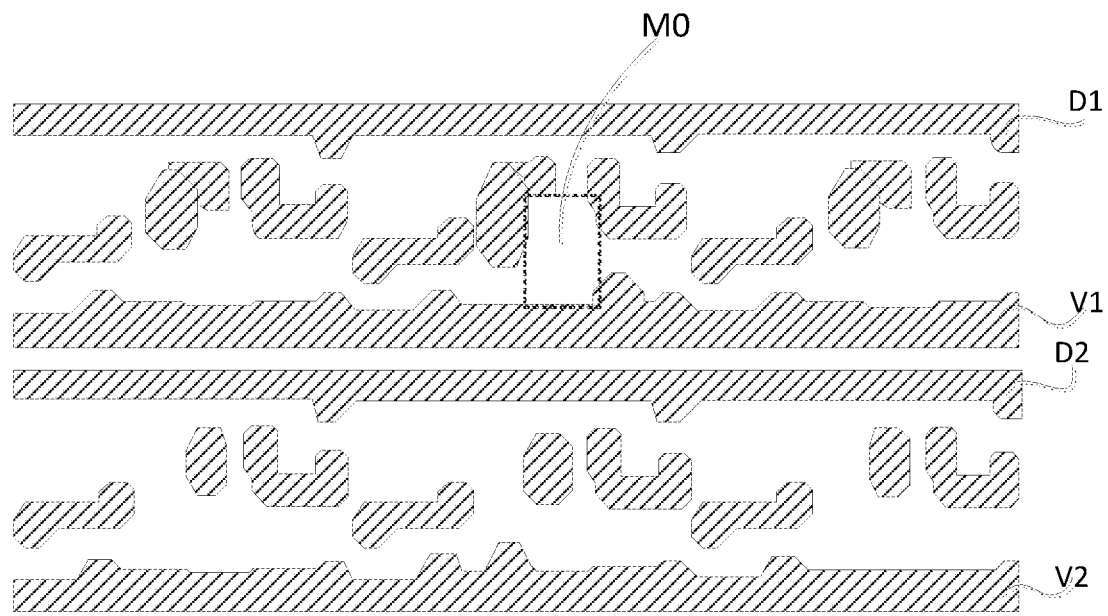
FIG. 2C is a top view of a first source-drain metal layer in FIG. 2A.
Figure 2D:
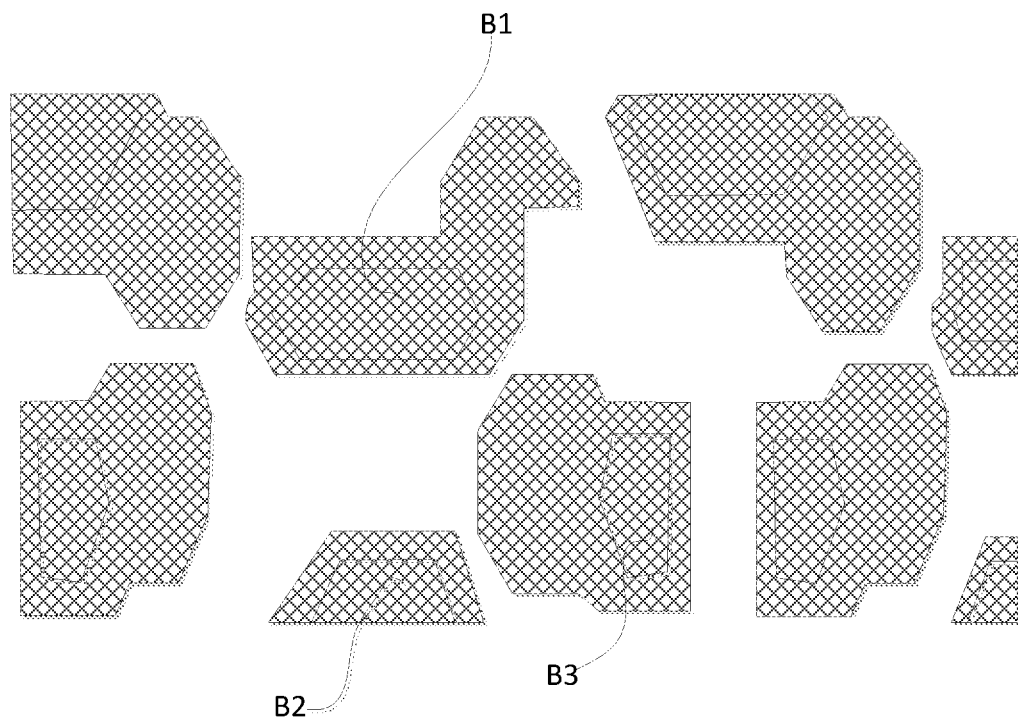
FIG. 2D is a top view of an anode pattern and an opening region of a pixel definition layer in FIG. 2A.

FIG. 2B is the top view of the shielding layer in FIG. 2A, FIG. 2C is the top view of the first source-drain metal layer in FIG. 2A, and FIG. 2D is the top view of the anode pattern and the opening region (which is a region in which the organic light emitting layer is provided) of pixel definition layer in FIG. 2A.

In FIG. 2B, the reference numeral H0 indicates the imaging pinhole, the reference numeral L01 indicates a first light leakage region included in the light shielding layer, the reference numeral L02 indicates a second light leakage region included in the light shielding layer, the reference numeral L03 indicates a third light leakage region included in the light shielding layer, the reference numeral L04 indicates a fourth light leakage region included in the light shielding layer, the reference numeral L05 indicates a fifth light leakage region included in the light shielding layer, and the reference numeral L06 indicates a sixth light leakage region included in the light shielding layer.

As shown in FIG. 2B, the light shielding layer includes the imaging pinhole H0, a first hollow structure S01, a second hollow structure S02, a third hollow structure S03, a fourth hollow structure S04, a fifth hollow structure S05, and a sixth hollow structure S06; the pattern of the light shielding layer further includes a first conductive intermediate-connection pattern portion N01, a second conductive intermediate-connection pattern portion N02, a third conductive intermediate-connection pattern portion N03, a fourth conductive intermediate-connection pattern portion N04, a fifth conductive intermediate-connection pattern portion N05, and a sixth conductive intermediate-connection pattern portion N06; an orthographic projection of N01 on the base substrate is within an orthographic projection of S01; an orthographic projection of N02 on the base substrate is within an orthographic projection of S02; an orthographic projection of N03 on the base substrate is within an orthographic projection of S03; an orthographic projection of N04 on the base substrate is within an orthographic projection of S04; an orthographic projection of N05 on the base substrate is within an orthographic projection of S05; and an orthographic projection of N06 on the base substrate is within an orthographic projection of S06;

the anode layer is connected to a drain of the semiconductor layer through the conductive intermediate-connection pattern portions;

furthermore, the portion included in the pattern of the light shielding layer other than the conductive intermediate-connection pattern portions may serve as a VDD signal functional layer.

In FIG. 2C, the reference numeral D1 indicates a first data line, the reference numeral V1 indicates a first power supply voltage line, the reference numeral D2 indicates a second data line, the reference numeral V2 indicates a second power supply voltage line, a region with the reference numeral MO is a region corresponding to the imaging pinhole H0, and an orthographic projection of MO on the base substrate overlaps with the orthographic projection of H0 on the base substrate substantially.

In FIG. 2D, the reference numeral B1 indicates an opening region of the pixel definition layer to be provided with the organic light emitting layer of the red sub-pixel, the reference numeral B2 indicates an opening region of the pixel definition layer to be provided with the organic light emitting layer of the blue sub-pixel, and the reference numeral B3 indicates an opening region of the pixel definition layer to be provided with the organic light emitting layer of the green sub-pixel.

Specifically, the angle may be greater than or equal to a second angle $\theta 1$ and less than or equal to a third angle $\theta 2$; the second angle $\theta 1$ is greater than the first angle $\theta$;

$\theta 1 = \arctan((c-d)/a)$, $\theta 2 = \arctan((b-e)/a)$;

where a is a first distance, b is a second distance, d is a third distance, e is a fourth distance, c is a fifth distance;

the first distance a is a difference between a minimum distance from the light reflection layer to the base substrate and a maximum distance from the imaging pinhole to the base substrate;

in a case that the organic light emitting layer of the sub-pixel in the display panel is placed in the horizontal direction, the second distance b is a sum of a shortest distance between the orthographic projection of the organic light emitting layer on the base substrate and the orthographic projection of the imaging pinhole on the base substrate, and the width of the imaging pinhole;

in a case that the organic light emitting layer is placed in the horizontal direction, the third distance d is a shortest distance between an orthographic projection on the base substrate of an intersection point of first light, which is emitted to the light reflection layer from an uppermost end of the organic light emitting layer, and the light reflection layer, and the orthographic projection on the base substrate of the organic light emitting layer;

in a case that the organic light emitting layer is placed in the horizontal direction, the fourth distance e is a shortest distance between an orthographic projection on the base substrate of an intersection point of second light, which is emitted to the light reflection layer from a lowermost end of the organic light emitting layer, and the light reflection layer, and the orthographic projection on the base substrate of the organic light emitting layer;

the fifth distance c is a shortest distance between the orthographic projection of the organic light emitting layer on the base substrate and an orthographic projection of the imaging pinhole on the base substrate;

in a case that the organic light emitting layer is placed in the horizontal direction, the first light is emitted to the light reflection layer, and reflected by the light reflection layer to become first reflection light which is emitted to a first end of the imaging pinhole;

in a case that the organic light emitting layer is placed in the horizontal direction, the second light is emitted to the light reflection layer, and reflected by the light reflection layer to become second reflection light which is emitted to a second end of the imaging pinhole; a distance between an orthographic projection of the second end of the imaging pinhole on the base substrate and the orthographic projection of the organic light emitting layer on the base substrate is greater than a distance between an orthographic projection of the first end of the imaging pinhole on the base substrate and the orthographic projection of the organic light emitting layer on the base substrate.

Figure 3:
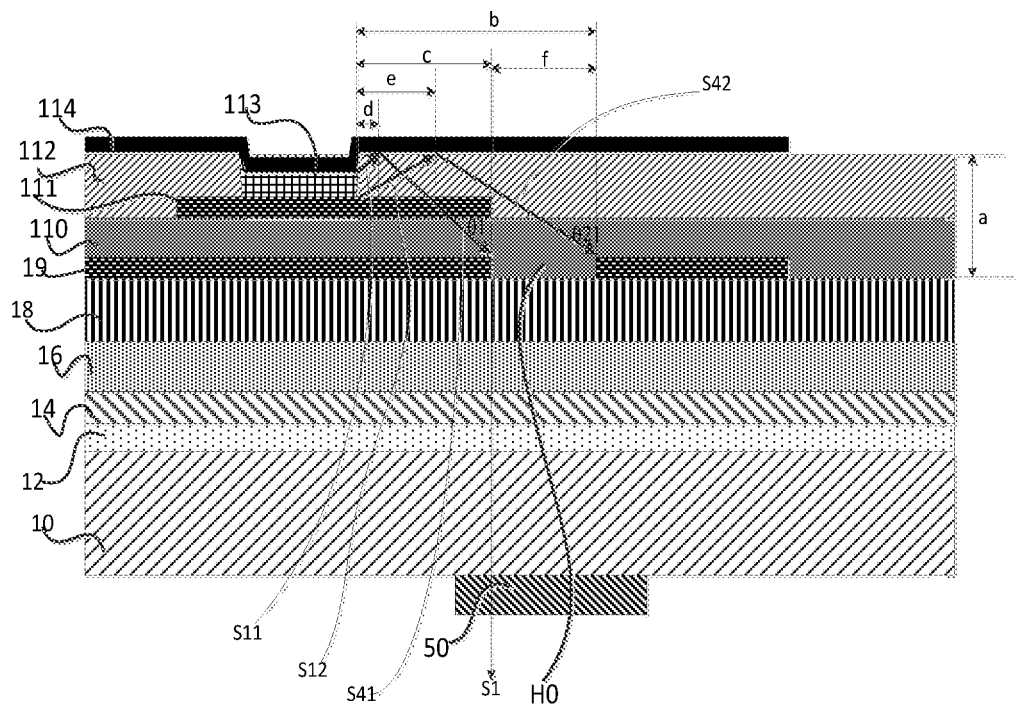
FIG. 3 is a cross-sectional view of a display panel according to at least one embodiment of the present disclosure.

As shown in FIG. 3, in at least one embodiment of the display panel shown in FIG. 1A, the organic light emitting layer 113 is placed in the horizontal direction, and the organic light emitting layer 113 is located on the left side of the imaging pinhole H0;

as shown in FIG. 3, the first distance a is the difference between the minimum distance from the light reflection layer 114 to the base substrate 10 and the maximum distance from the imaging pinhole H0 to the base substrate 10;

the fifth distance c is the shortest distance between the orthographic projection of the organic light emitting layer 113 on the base substrate 10 and the orthographic projection of the imaging pinhole H0 on the base substrate 10;

the second distance b is the sum of the shortest distance (i.e., the fifth distance c) between the orthographic projection of the organic light emitting layer 113 on the base substrate 10 and the orthographic projection of the imaging pinhole H0 on the base substrate 10, and the width f of the imaging pinhole H0;

the third distance d is the shortest distance between the orthographic projection on the base substrate 10 of the intersection point of the first light S11, which is emitted to the light reflection layer 114 from the uppermost end of the organic light emitting layer 113, and the light reflection layer 114, and the orthographic projection on the base substrate 10 of the organic light emitting layer 113;

the fourth distance e is the shortest distance between an orthographic projection on the base substrate 10 of the intersection point of the second light S12, which is emitted to the light reflection layer 14 from the lowermost end of the organic light emitting layer 113, and the light reflection layer 14, and the orthographic projection on the base substrate 10 of the organic light emitting layer 113;

in the embodiment shown in FIG. 3, the first light S11 is emitted to the light reflection layer 114, and is reflected by the light reflection layer 114 to become the first reflection light S41. The first reflection light S41 is emitted to the first end of the imaging pinhole H0;

the second light S12 is emitted to the light reflection layer 114, and is reflected by the light reflection layer 114 to become the second reflection light S42. The second reflection light S42 is emitted to the second end of the imaging pinhole H0. In the embodiment shown in FIG. 3, the angle between the first reflection light S41 and the second reflection light S42 is the second $\theta1$;

the angle between the second reflection light S42 and the first direction S1 is the third angle $\theta2$;

the first direction S1 is a direction perpendicular to the light shielding layer 19 and directing to the base substrate 10.

In the embodiment shown in FIG. 3, a is equal to 3.5 microns, b is equal to 12.13 microns, c is equal to 8.98 microns, d is equal to 1.62 microns, e is equal to 3.29 microns, and $\theta$ is equal to 45 degrees;

$\theta1 = \arctan((c-d)/a) = \arctan((8.98-1.62)/3.5) = 51.3°$;

$\theta2 = \arctan((b-e)/a) = \arctan((12.13-3.29)/3.5) = 68.4°$;

It can be seen from the above that $\theta1$ is greater than $\theta$ and $\theta2$ is greater than $\theta$. Thus, after the light emitted by the organic light emitting layer 113 is reflected by the light reflection layer 114, the resulting reflected light will not enter the imaging pinhole H0, reducing stray light.

Figure 7A:
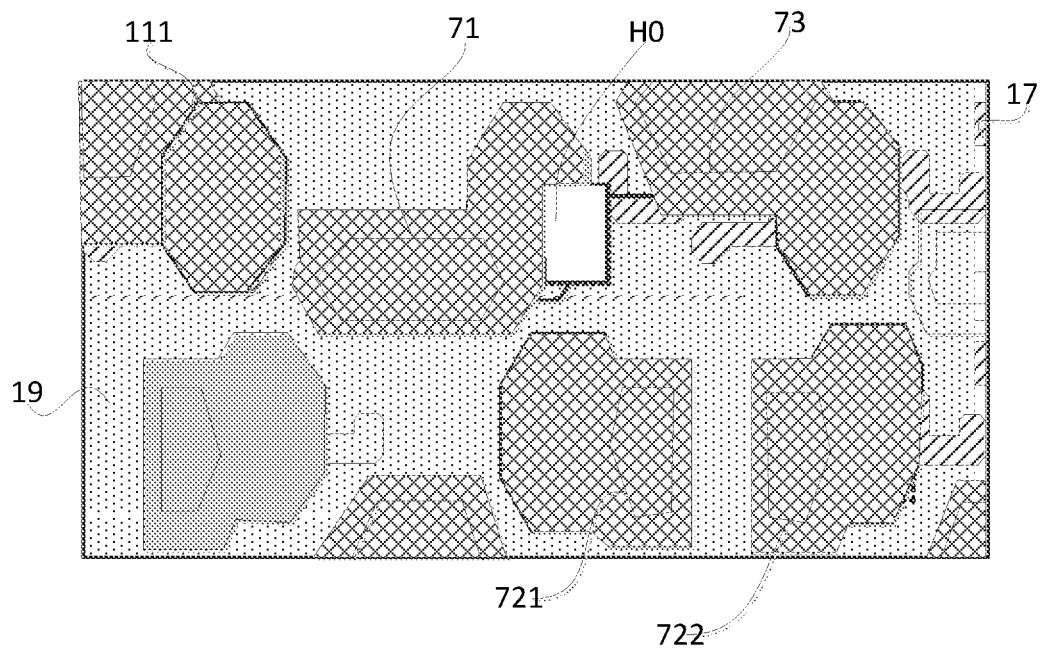
FIG. 7A is a top view of a display panel illustrating opening regions on the basis of FIG. 6.
Figure 7B:
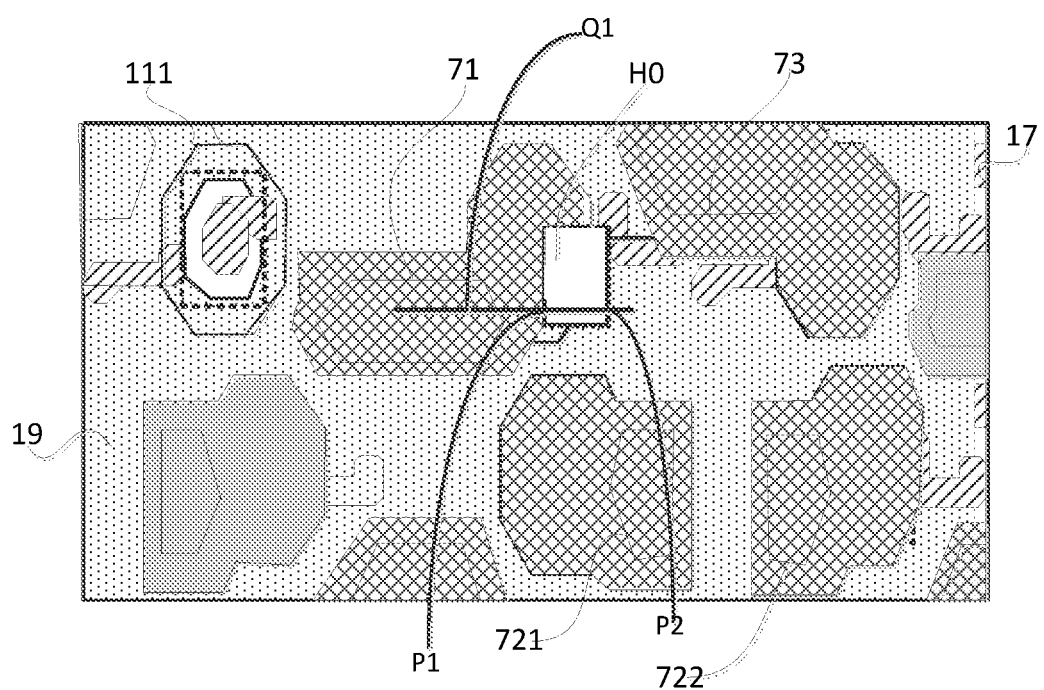
FIG. 7B is a schematic diagram in which a first cut line Q1 is added on the basis of FIG. 7A.

FIG. 3 is a cross-sectional view along the first cut line Q1 in FIG. 7B. In FIG. 7B, the reference numeral P1 indicates the first end, and the reference numeral P2 indicates the second end. The extending direction of the first cut line Q1 is substantially parallel to the extending direction of the data line (in the embodiment of FIG. 7B, the signal line included in the first source-drain metal layer 17 that is the first horizontal line from the top to the bottom is the data line). Also, in FIG. 7B, the width of the imaging pinhole H0 is the distance between the first end P1 and the second end P2.

In at least one embodiment of the present disclosure, when the first cut line Q1 is changed, the first end and the second end are changed accordingly. In the case that the first cut line Q1 is changed, since the first cut line Q1 needs to pass through the imaging pinhole H0, the first end may be the end closest to the organic light emitting layer in the ends of the first cut line Q1 that is in contact with the edges of the imaging pinhole H0, and the second end may be the end farthest from the organic light emitting layer in the ends of the first cut line Q1 that is in contact with the edges of the imaging pinhole H0. When detecting $\theta1$ and $\theta2$, only one first cut line may be selected, and then $\theta1$ and $\theta2$ are detected according to the first end and the second end determined by the first cut line. Alternatively, multiple first cut lines may be selected, and multiple $\theta1$s and $\theta2$s are detected according to the first ends and the second ends respectively determined by the multiple first cut lines. A final $\theta1$ is obtained by averaging the multiple $\theta1$s, and a final $\theta2$ is obtained by averaging the multiple $\theta2$s; or the maximum value among the multiple $\theta1$s is set as the final $\theta1$, and the maximum value among the multiple $\theta2$s is set as the final $\theta2$, but they are not limited thereto.

In at least one embodiment shown in FIGS. 1A and 3 of the present disclosure, the imaging pinhole H0 is set close to the organic light emitting layer 113 in the red sub-pixel so that the fingerprint recognition sensor included in the fingerprint recognition array layer 50 has a decreased sensitivity to the red light emitted by the organic light emitting layer 113 in the red sub-pixel, thereby reducing the stray light, and improving the fingerprint recognition imaging effect.

In the embodiment shown in FIGS. 1A and 3, the thickness of the first insulation layer 12 may be greater than or equal to 1116 angstroms and less than or equal to 1284 angstroms, the thickness of the first gate insulation layer 14 may be greater than or equal to 1235 angstroms and less than or equal to 1365 angstroms, the thickness of the second gate insulation layer 16 may be greater than or equal to 4650 angstroms and less than or equal to 5350 angstroms, the thickness of the second insulation layer 18 may be greater than or equal to 10200 angstroms and less than or equal to 15000 angstroms, the thickness of the planarization layer 110 may be greater than or equal to 14550 angstroms and less than or equal to 15450 angstroms, the thickness of the pixel definition layer 112 may be greater than or equal to 19400 angstroms and less than or equal to 30000 angstroms, the thickness of the organic light emitting layer 113 may be greater than or equal to 500 nm (nanometer) and less than or equal to 600 nm, but they are not limited thereto.

In at least one embodiment of the present disclosure, preferably, the thickness of the organic light emitting layer is greater than or equal to 500 nm (nanometer) and less than or equal to 600 nm, but not limited thereto.

Figure 4:
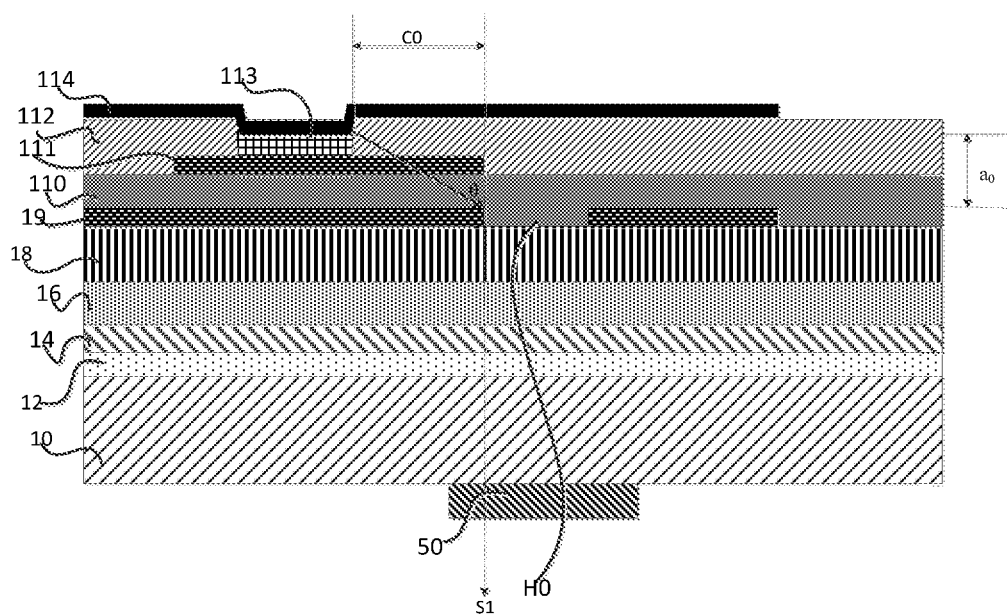
FIG. 4 is a cross-sectional view of a model of a display panel for detecting a first angle θ.

In at least one embodiment of the present disclosure, the first angle θ may be detected according to the following method:

providing a model of a display panel for detecting the first angle θ, a structure of the model of the display panel differs from the at least one embodiment of the display panel as shown in FIG. 1A of the present disclosure only in that: the shortest distance (or the fifth distance c) between the orthographic projection of the organic light emitting layer 113 on the base substrate 10 and the orthographic projection of the imaging pinhole H0 on the base substrate 10 is different;

in a case that the fifth distance c is shorter, the light emitted by the organic light emitting layer 113 and reflected by the light reflection layer 113 can enter the imaging pinhole H0 easily;

when detecting the first angle θ, different values of the fifth distance c are provided in order to find a critical distance c0. In other words, when c is equal to c0, the light emitted by the organic light emitting layer 113 and reflected by the light reflecting layer 113 will not enter the fingerprint recognition sensor provided on the base substrate 10 through the imaging pinhole H0; however, when c is less than c0, the light emitted by the organic light emitting layer 113 and reflected by the light reflection layer 113 will enter the fingerprint recognition sensor provided on the base substrate 10 through the imaging pinhole H0;

It has been found through experiments that, corresponding to at least one embodiment of the display panel shown in FIG. 1A, the critical distance c0 is equal to 5.98 microns, and as shown in FIG. 4, in the model of the display panel for detecting the first angle θ, $a_0$ is the difference between the maximum distance from the organic light emitting layer 113 to the base substrate 10 and the maximum distance between the imaging pinhole H0 and the base substrate 10, $a_0$ is equal to 2.42 microns, then $\theta = \arctan(c0/a_0) = 45°$.

In a specific implementation, when one or more of the first distance a, the second distance b, the third distance d, the fourth distance e, the maximum distance between the organic light emitting layer 113 and the base substrate 10, the maximum distance $a_0$ between the imaging pinhole H0 and the base substrate 10, and thicknesses of individual film layers in the display panel of at least one embodiment of the present disclosure are changed, the first angle θ will be changed correspondingly.

In a specific implementation, the display panel may further include an anode layer provided between the light shielding layer and the pixel definition layer;

the orthographic projection of the imaging pinhole on the base substrate does not overlap with the orthographic projection of the anode layer on the base substrate.

In at least one embodiment of the present disclosure, the anode layer may be made of a metal material capable of reflecting light, for example, may be made of silver. Thus, it is required that the imaging pinhole is not covered by the anode layer, so that light can pass through the imaging pinhole to the fingerprint recognition sensor.

Specifically, the display panel further includes a thin film transistor array layer provided between the base substrate and the anode layer;

an orthographic projection of a metal film layer in the thin film transistor array layer on the base substrate does not overlap with the orthographic projection of the imaging pinhole on the base substrate.

In at least one embodiment of the present disclosure, it is required that the orthographic projection of the imaging pinhole on the base substrate does not overlap with the orthographic projection of the metal film layer in the thin film transistor array layer on the base substrate, so that light can pass through the imaging pinhole to the fingerprint recognition sensor.

In at least one embodiment of the present disclosure, the thin film transistor array layer may include a first gate metal layer, a first gate insulation layer, a second gate metal layer, a second gate insulation layer, a first source-drain metal layer and a second insulation layer, and the metal film layer in the thin film transistor array layer may include a first gate metal layer, a second gate metal layer, and a first source-drain metal layer, but they are not limited thereto.

In at least one embodiment of the present disclosure, the light shielding layer may be a metal layer, and the pattern of the light shielding layer may include a power supply voltage pattern portion for receiving a power supply voltage signal. The projections of the power supply voltage pattern portion and the conductive intermediate-connection pattern portion on the substrate do not overlap with each other, but they are not limited thereto.

Specifically, the power supply voltage pattern portion and the conductive intermediate-connection pattern portion are not electrically connected with each other directly.

Specifically, the display panel of at least one embodiment of the present disclosure may further include a fingerprint recognition array layer; the fingerprint recognition array layer may be provided on a side of the base substrate away from the light shielding layer, and include fingerprint recognition sensors arranged in an array;

the light shielding layer is provided on the light incoming side of the fingerprint recognition sensor.

Figure 5:
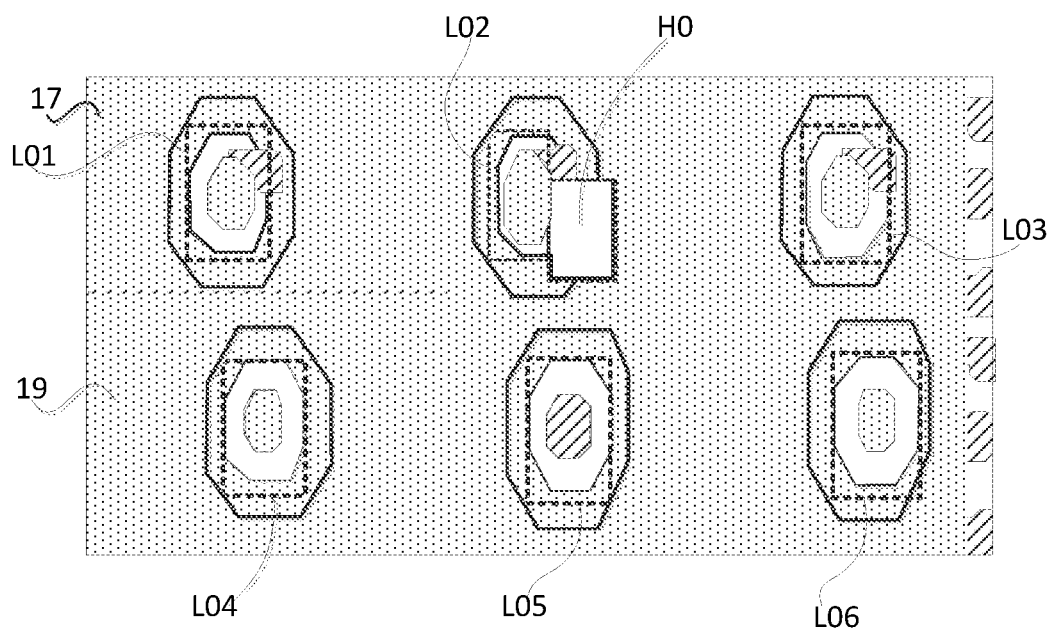
FIG. 5 is a top view of at least one embodiment of a display panel according to at least one embodiment of the present disclosure during manufacture of the display panel.
Figure 6:
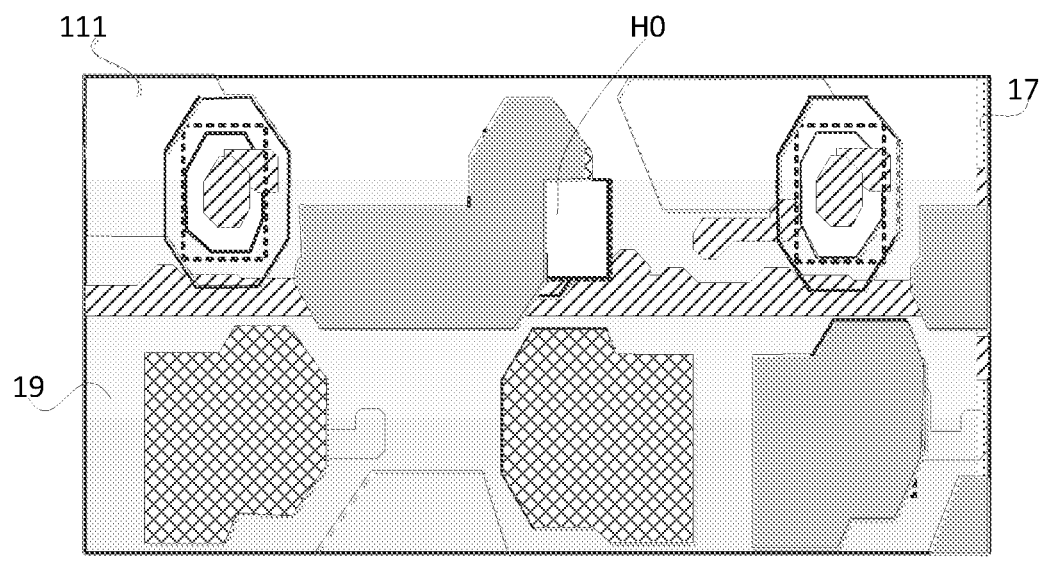
FIG. 6 is a top view of a display panel provided with an anode layer 111 on the basis of FIG. 5.

When manufacturing the display panel of at least one embodiment of the present disclosure, an active layer, a first insulation layer, a first gate metal layer, a first gate insulation layer, a second gate metal layer, a second gate insulation layer, a first source-drain metal layer, a second insulation layer, and a light shielding layer are formed on the base substrate in sequence. FIG. 5 is a top view of the display panel with the light shielding layer 19 formed (the anode layer has not been manufactured yet at this time). In FIG. 5, the reference number 17 indicates the first source-drain metal layer, the reference number 19 indicates the light shielding layer, the reference numeral H0 indicates the imaging pinhole, the reference numeral L01 indicates a first light leakage region included in the light shielding layer 19, the reference numeral L02 indicates a second light leakage region included in the light shielding layer 19, the reference numeral L03 indicates a third light leakage region included in the light shielding layer 19, the reference numeral L04 indicates a fourth light leakage region included in the light shielding layer 19, the reference numeral L05 indicates a fifth light leakage region included in the light shielding layer 19, and the reference numeral L06 indicates a sixth light leakage region included in the light shielding layer 19;

As shown in FIG. 6, an anode layer 111 is then manufactured, the anode layer 111 covering the light leakage regions on the light shielding layer 19; as shown in FIG. 6, the anode layer 111 does not cover the imaging aperture H0;

As shown in FIG. 7A, a pixel definition layer is then manufactured, and FIG. 7A illustrates the opening regions formed on the pixel definition layer;

in FIG. 7A, the reference numeral 71 indicates a first opening region in which the organic light emitting layer included in the red sub-pixel is to be formed. The reference numeral 721 is a first portion of a second opening region, and the reference numeral 722 is a second portion of the second opening region. In the second opening region, the organic light emitting layer included in the gree sub-pixel is to be formed. The reference numeral 73 indicates a third opening region in which the organic light emitting layer included in the blue sub-pixel is to be formed. As shown in FIG. 7A, the minimum distance between the imaging pinhole H0 and the first opening region 71 is smaller than the minimum distance between the imaging pinhole H0 and the second opening region, the minimum distance between the imaging pinhole H0 and the first opening region 71 is smaller than the minimum distance between the imaging pinhole H0 and the third opening region 73.

In at least one embodiment of the present invention, each of the light leakage regions included in the light shielding layer 19 may be: a region that can transmit light included by the light shielding layer 19 other than the imaging pinhole.

Figure 7C:
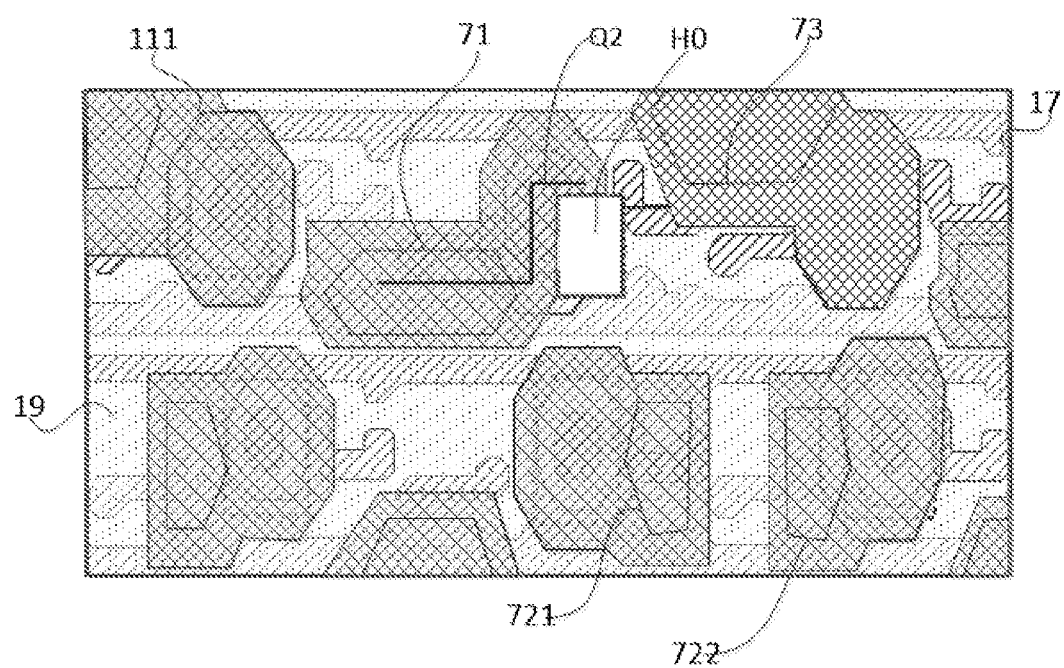
FIG. 7C is a schematic diagram in which a second cut line Q2 is added on the basis of FIG. 7A.

FIG. 1A is a cross-sectional view along the first cut line Q1 in FIG. 7B, and FIG. 1B is a cross-sectional view along the second cut line Q2 in FIG. 7C.

In FIG. 7B, the reference numeral P1 indicates the first end of the imaging pinhole H0, and the reference numeral P2 indicates the second end of the imaging pinhole H0.

Optionally, the thin film transistor array layer may include a first source-drain metal layer and a semiconductor layer;

the anode layer of the red sub-pixel closest to the imaging pinhole is connected to the light shielding layer through a first via, the light shielding layer is connected to the first source-drain metal layer through a second via, the first source-drain metal layer is connected to a drain region of the semiconductor layer through a third via, so as to receive a data voltage signal.

In at least one embodiment of the present disclosure, the light shielding layer may be a metal layer.

In at least one embodiment of the present disclosure, semiconductor layer may be the active layer, but not limited to this.

Since the red sub-pixel is adjacent to the imaging pinhole and the distance between the red sub-pixel and the imaging pinhole is relatively short, it is necessary to provide the second via between the light shielding layer and the first source-drain metal layer for intermediate connection, in order to avoid the mutual influence between the imaging pinhole and the via.

Optionally, the thin film transistor array layer includes a semiconductor layer; an anode of the blue sub-pixel adjacent to the imaging pinhole is connected to a drain region of the semiconductor layer through a via, so as to receive a data voltage signal.

Optionally, the thin film transistor array layer includes a semiconductor layer; an anode of the green sub-pixel adjacent to the imaging pinhole is connected to a drain region of the semiconductor layer through a via, so as to receive a data voltage signal.

As for the green sub-pixel or blue sub-pixel adjacent to the imaging pinhole, since the distance from it to the imaging pinhole is relatively long, it is not necessary to provide a via for intermediate connection, and thus the anode layer of the green sub-pixel or the blue sub-pixel can be electrically connected to the drain region of the active layer through a via so as to receive the data voltage signal.

Optionally, the thin film transistor array layer includes a semiconductor layer;

the light shielding layer further includes a hollow structure, a pattern of the light shielding layer further includes a conductive intermediate-connection pattern portion; an orthographic projection of the conductive intermediate-connection pattern portion on the base substrate is within an orthographic projection of the hollow structure on the base substrate;

the anode layer is connected to the drain region of the semiconductor layer through the conductive intermediate-connection pattern portion. As shown in FIG. 2B, the light shielding layer may further include the hollow structures, the pattern of the light shielding layer further includes the conductive intermediate-connection pattern portions disposed within the hollow structures so that the conductive connection patterns are insulated from the VDD signal functional layer (the portion included in the pattern of the light shielding layer other than the conductive intermediate-connection pattern portions may serve as a VDD signal functional layer).

Figure 8:
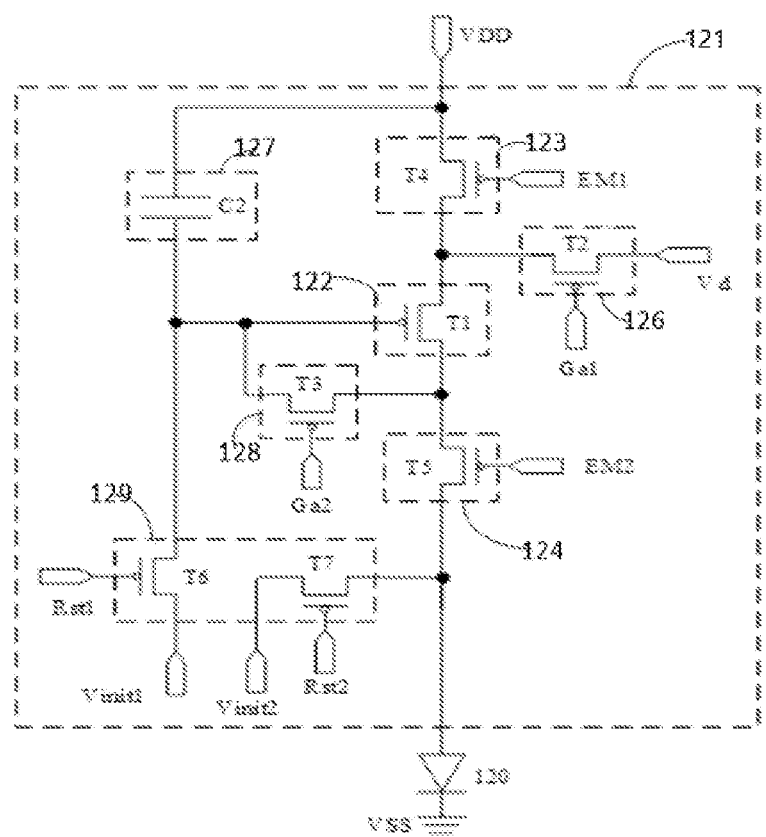
FIG. 8 is a circuit diagram of an embodiment of a pixel circuit included in a sub-pixel in a display panel according to at least one embodiment of the present disclosure.

A circuit diagram of an embodiment of a pixel circuit included in a sub-pixel in a display panel according to at least one embodiment of the present disclosure may be as shown in FIG. 8.

As shown in FIG. 8, the pixel circuit 121 may include a light emitting element 120, a drive circuit 122, a first light emitting control circuit 123, and a second light emitting control circuit 124. The drive circuit 122 includes a control terminal, a first terminal, and a second terminal, and is configured to provide the light emitting element 120 with a driving current that drives the light emitting element 120 to emit light. For example, the first light emitting control circuit 123 is connected to the first terminal of the drive circuit 122 and the power supply voltage terminal for supplying the power supply voltage signal VDD, and is configured to control the drive circuit 122 to be connected to or disconnected from the power supply voltage terminal for supplying the power supply voltage signal VDD. The second light emitting control circuit 124 is electrically connected to the second terminal of the drive circuit 122 and the first light emitting voltage applying electrode of the light emitting element 120, and is configured to control the drive circuit 122 to be connected to or disconnected from the light emitting element 120.

As shown in FIG. 8, the pixel circuit 121 further includes a data writing circuit 126, a storage circuit 127, a threshold compensation circuit 128 and a reset circuit 129. The data writing circuit 126 is electrically connected to the first terminal of the drive circuit 122, and is configured to write the data voltage on the data line Vd to the storage circuit 127 under the control of the scan signal; the storage circuit 127 is electrically connected to the control terminal of the drive circuit 122 and the power supply voltage terminal, and is configured to store the data voltage; the threshold compensation circuit 128 is electrically connected to the control terminal of the drive circuit 122 and the second terminal of the drive circuit 122, and is configured to perform threshold compensation on the drive circuit 122; the reset circuit 129 is electrically connected to the control terminal of the drive circuit 122 and the first light emitting voltage applying electrode of the light emitting element 120, and is configured to reset the control terminal of the drive circuit 122 and the first light emitting voltage applying electrode of the light emitting element 120 under the control of the reset control signal.

For example, as shown in FIG. 8, the drive circuit 122 includes a drive transistor T1, the control terminal of the drive circuit 122 includes the gate of the drive transistor T1, the first terminal of the drive circuit 122 includes the first electrode of the drive transistor T1, and the second terminal of the drive circuit 122 includes the second electrode of the drive transistor T1.

For example, as shown in FIG. 8, the data writing circuit 126 includes a data writing transistor T2, the storage circuit 127 includes a storage capacitor C2, the threshold compensation circuit 128 includes a threshold compensation transistor T3, the first light emitting control circuit 123 includes a first light emitting control transistor T4, the second light emitting control circuit 124 includes a second light emitting control transistor T5, the reset circuit 129 includes a first reset transistor T6 and a second reset transistor T7, and the reset control signal may include a first reset control sub-signal and a second reset control sub-signal.

For example, as shown in FIG. 8, the first electrode of the data writing transistor T2 is electrically connected to the first electrode of the drive transistor T1, the second electrode of the data writing transistor T2 is configured to be electrically connected to the data line Vd to receive the data voltage, and the gate of the data writing transistor T2 is configured to be electrically connected to the first gate line Ga1 to receive the scan signal; the first polar plate CC1a of the storage capacitor C2 is electrically connected to the power supply voltage terminal, the second polar plate CC2a of the storage capacitor C2 is electrically connected to the gate of the drive transistor T1; the first electrode of the threshold compensation transistor T3 and the second electrode of the drive transistor T1, the second electrode of the threshold compensation transistor T3 is electrically connected to the gate of the drive transistor T1, and the gate of the threshold compensation transistor T3 is configured to be electrically connected to the second gate line Ga2 to receive the compensation control signal; the first electrode of the first reset transistor T6 is configured to be electrically connected to the first reset power supply terminal Vinit1 to receive the first reset signal, the second electrode of the first reset transistor T6 is electrically connected to the gate of the drive transistor T1, and the gate of the first reset transistor T6 is configured to be electrically connected to the first reset control signal line Rst1 to receive the first reset control sub-signal; the first electrode of the second reset transistor T7 is configured to be electrically connected to the second reset power supply terminal Vinit2 to receive the second reset signal, and the second electrode of the second reset transistor T7 is electrically connected to the first light emitting voltage application electrode of the light emitting element 120, the gate of the second reset transistor T7 is configured to be electrically connected to the second reset control signal line Rst2 to receive the second reset control sub-signal; the first electrode of the first light emitting control transistor T4 is connected with the power supply voltage signal VDD, the second electrode of the first emitting control transistor T4 is electrically connected to the first electrode of the drive transistor T1, and the gate of the first emitting control transistor T4 is configured to be electrically connected to the first emitting control signal line EM1 to receive the first emitting control signal; the first electrode of the second light emitting control transistor T5 is electrically connected to the second electrode of the drive transistor T1, the second electrode of the second light emitting control transistor T5 is electrically connected to the first light emitting voltage application electrode of the light emitting element 120, the gate of the second light emitting control transistor T5 is configured to be electrically connected to the second light emitting control signal line EM2 to receive the second light emitting control signal; the second light emitting voltage application electrode of the light emitting element 120 is electrically connected to the low voltage terminal VSS.

It should be noted that the transistors used in the embodiments of the present disclosure may be thin film transistors, field effect transistors, or other switching devices with the same characteristics. The thin film transistors may include oxide semiconductor thin film transistors, amorphous silicon thin film transistors, or polycrystalline silicon thin film transistors, or the like. The source and drain of a transistor can be symmetrical in structure, so their source and drain can be indistinguishable in physical structure. In the embodiments of the present disclosure, in order to distinguish the transistors, in addition to the gate as the control electrode, one of the other two electrodes is directly described as the first electrode, and the other as the second electrode. Thus, in all or some of the transistors in the embodiments of the present disclosure, the first and second electrodes are interchangeable as needed.

In at least one embodiment of the present disclosure, the first light emitting voltage application electrode of the light emitting element 120 may be the anode, and the second light emitting voltage application electrode of the light emitting element 120 may be the cathode; the anode layer is connected to the second light emitting control transistor T5 through a via.

A manufacturing method of a display panel according to at least one embodiment of the present disclosure is used for manufacturing a display panel. The display panel includes red sub-pixels, green sub-pixels, and blue sub-pixels. The manufacturing method of a display panel includes:
    forming a light shielding layer and a pixel definition layer on a base substrate in sequence; opening regions arranged in an array being formed on the pixel definition layer; the light shielding layer including an imaging pinhole;
    forming an organic light emitting layer in the opening region;
    providing a light reflection layer on a side of the organic light emitting layer away from the light shielding layer;
    providing a plurality of fingerprint recognition sensors arranged in an array on a side of the base substrate away from the light shielding layer;
    setting a minimum distance between the imaging pinhole and the organic light emitting layer in the red sub-pixel to be less than a minimum distance between the imaging pinhole and the organic light emitting layer in the green sub-pixel;

setting the minimum distance between the imaging pinhole and the organic light emitting layer in the red sub-pixel to be less than a minimum distance between the imaging pinhole and the organic light emitting layer in the blue sub-pixel.

The manufacturing method of a display panel according to at least one embodiment of the present disclosure sets the imaging pinhole to be closer to the red sub-pixel to eliminate the effect of red stray light on the pinhole imaging fingerprint recognition. By setting the location of the imaging pinhole, the fingerprint recognition effect of the pinhole imaging is improved.

Optionally, an angle between light that is emitted from the organic light emitting layer and reflected by the light reflection layer to the imaging pinhole and a first direction is greater than a first angle θ, so that the light cannot pass through the imaging pinhole to the fingerprint recognition sensor;

the first direction is a direction perpendicular to the light shielding layer and directing to the base substrate.

In the manufacturing method of a display panel according to at least one embodiment of the present disclosure, by setting the location of the imaging pinhole, the angle between light that is emitted from the organic light emitting layer and reflected by the light reflection layer to the imaging pinhole and the first direction is made to be greater than the first angle θ, so that the light (which is stray light) can be controlled to not pass through the imaging pinhole to the fingerprint recognition sensor, thereby improving the accuracy of the pinhole imaging fingerprint recognition.

Specifically, θ can be greater than 20 degrees, but not limited thereto.

A display device according to at least one embodiment of the present disclosure includes the above display panel.

The display device according to at least one embodiment of the present disclosure may be any product or component with a display function such as a mobile phone, a tablet, a TV, a display, a notebook, a digital photo frame, a navigator, and the like.

The above are the preferred embodiments of the present disclosure. It should be noted that for those of ordinary skill in the art, without departing from the principle of the present disclosure, many improvements and modifications can be made. These improvements and modifications should also be regarded as the protective scope of the present disclosure.

What is claimed is:

1. A display panel, comprising a base substrate, a light shielding layer and a pixel definition layer which are provided on the base substrate in turn, opening regions arranged in an array are formed on the pixel definition layer;
   wherein the display panel further comprises an organic light emitting layer formed in the opening regions, and a light reflection layer provided on a side of the organic light emitting layer away from the light shielding layer;
   the light shielding layer comprises an imaging pinhole;
   the display panel further comprises a plurality of fingerprint recognition sensors arranged in an array, the fingerprint recognition sensors are arranged on a side of the base substrate away from the light shielding layer; the light shielding layer is provided on a light incoming side of the fingerprint recognition sensors;
   pixels in the display panel comprise red sub-pixels, green sub-pixels and blue sub-pixels;
   a minimum distance between the imaging pinhole and the organic light emitting layer in the red sub-pixel is less than a minimum distance between the imaging pinhole and the organic light emitting layer in the green sub-pixel;
   the minimum distance between the imaging pinhole and the organic light emitting layer in the red sub-pixel is less than a minimum distance between the imaging pinhole and the organic light emitting layer in the blue sub-pixel.

2. The display panel according to claim 1, wherein,
   an angle between light that is emitted from the organic light emitting layer and reflected by the light reflection layer to the imaging pinhole and a first direction is greater than a first angle θ, so that the light cannot pass through the imaging pinhole to the fingerprint recognition sensor;
   the first direction is a direction perpendicular to the light shielding layer and directing to the base substrate.

3. The display panel according to claim 2, wherein the first angle θ is greater than or equal to 20 degrees.

4. The display panel according to claim 2, wherein the angle is greater than or equal to a second angle θ1 and less than or equal to a third angle θ2; the second angle θ1 is greater than the first angle θ;
   θ1=arctan((c−d)/a), θ2=arctan((b−e)/a);
   where a is a first distance, b is a second distance, d is a third distance, e is a fourth distance, c is a fifth distance;
   the first distance a is a difference between a minimum distance from the light reflection layer to the base substrate and a maximum distance from the imaging pinhole to the base substrate;
   in a case that the organic light emitting layer of the sub-pixel in the display panel is placed in a horizontal direction, the second distance b is a sum of a shortest distance between an orthographic projection of the organic light emitting layer on the base substrate and an orthographic projection of the imaging pinhole on the base substrate, and a width of the imaging pinhole;
   in a case that the organic light emitting layer is placed in the horizontal direction, the third distance d is a shortest distance between an orthographic projection on the base substrate of an intersection point of first light, which is emitted to the light reflection layer from an uppermost end of the organic light emitting layer, and the light reflection layer, and the orthographic projection on the base substrate of the organic light emitting layer;
   in a case that the organic light emitting layer is placed in the horizontal direction, the fourth distance e is a shortest distance between an orthographic projection on the base substrate of an intersection point of second light, which is emitted to the light reflection layer from a lowermost end of the organic light emitting layer, and the light reflection layer, and the orthographic projection on the base substrate of the organic light emitting layer;
   the fifth distance c is a shortest distance between the orthographic projection of the organic light emitting layer on the base substrate and an orthographic projection of the imaging pinhole on the base substrate;
   in a case that the organic light emitting layer is placed in the horizontal direction, the first light is emitted to the light reflection layer, and reflected by the light reflection layer to become first reflection light which is emitted to a first end of the imaging pinhole;

in a case that the organic light emitting layer is placed in the horizontal direction, the second light is emitted to the light reflection layer, and reflected by the light reflection layer to become second reflection light which is emitted to a second end of the imaging pinhole; a distance between an orthographic projection of the second end of the imaging pinhole on the base substrate and the orthographic projection of the organic light emitting layer on the base substrate is greater than a distance between an orthographic projection of the first end of the imaging pinhole on the base substrate and the orthographic projection of the organic light emitting layer on the base substrate.

5. The display panel according to claim 1, wherein a thickness of the organic light emitting layer is greater than or equal to 500 nm and less than or equal to 600 nm.

6. The display panel according to claim 1, wherein the display panel further comprises an anode layer provided between the light shielding layer and the pixel definition layer;
an orthographic projection of the imaging pinhole on the base substrate does not overlap with an orthographic projection of the anode layer on the base substrate.

7. The display panel according to claim 6, wherein the display panel further comprises a thin film transistor array layer provided between the base substrate and the anode layer;
an orthographic projection of a metal film layer in the thin film transistor array layer on the base substrate does not overlap with the orthographic projection of the imaging pinhole on the base substrate.

8. The display panel according to claim 7, wherein the thin film transistor array layer comprises a first source-drain metal layer and a semiconductor layer; the light shielding layer is a metal layer;
the anode layer of a red sub-pixel closest to the imaging pinhole is connected to the light shielding layer through a first via, the light shielding layer is connected to the first source-drain metal layer through a second via, the first source-drain metal layer is connected to a drain region of the semiconductor layer through a third via, so as to receive a data voltage signal.

9. The display panel according to claim 8, wherein the thin film transistor array layer comprises a semiconductor layer;
the light shielding layer further comprises a hollow structure, a pattern of the light shielding layer further comprises a conductive intermediate-connection pattern portion; an orthographic projection of the conductive intermediate-connection pattern portion on the base substrate is located within an orthographic projection of the hollow structure on the base substrate;
the anode layer is connected to the drain region of the semiconductor layer through the conductive intermediate-connection pattern portion.

10. The display panel according to claim 9, wherein the pattern of the light shielding layer further comprises a power supply voltage pattern portion for receiving a power supply voltage signal, an orthographic projection of the power supply voltage pattern portion on the base substrate does not overlap with an orthographic projection of the conductive intermediate-connection pattern portion on the base substrate.

11. The display panel according to claim 7, wherein the thin film transistor array layer comprises a semiconductor layer; an anode of a blue sub-pixel adjacent to the imaging pinhole is connected to a drain region of the semiconductor layer through a via, so as to receive a data voltage signal.

12. The display panel according to claim 7, wherein the thin film transistor array layer comprises a semiconductor layer; an anode of a green sub-pixel adjacent to the imaging pinhole is connected to a drain region of the semiconductor layer through a via, so as to receive a data voltage signal.

13. A display device comprising the display panel according to claim 1.

14. A manufacturing method of a display panel comprising red sub-pixels, green sub-pixels and blue sub-pixels; wherein the manufacturing method of a display panel comprises:
forming a light shielding layer and a pixel definition layer on a base substrate in sequence; opening regions arranged in an array being formed on the pixel definition layer; the light shielding layer comprising an imaging pinhole;
forming an organic light emitting layer in the opening region;
providing a light reflection layer on a side of the organic light emitting layer away from the light shielding layer;
providing a plurality of fingerprint recognition sensors arranged in an array on a side of the base substrate away from the light shielding layer;
setting a minimum distance between the imaging pinhole and the organic light emitting layer in the red sub-pixel to be less than a minimum distance between the imaging pinhole and the organic light emitting layer in the green sub-pixel;
setting the minimum distance between the imaging pinhole and the organic light emitting layer in the red sub-pixel to be less than a minimum distance between the imaging pinhole and the organic light emitting layer in the blue sub-pixel.

\* \* \* \* \*